(12) United States Patent
Gottwald

(10) Patent No.: US 7,048,547 B2
(45) Date of Patent: May 23, 2006

(54) PLUG

(75) Inventor: Gerd Gottwald, Wannweil (DE)

(73) Assignee: HIrschmann Electronics GmbH & Co. KG, Neckartenzlingen (DE)

( * ) Notice: Subject to any disclaimer, the term of this patent is extended or adjusted under 35 U.S.C. 154(b) by 0 days.

(21) Appl. No.: 10/503,783

(22) PCT Filed: Nov. 28, 2002

(86) PCT No.: PCT/EP02/13444

§ 371 (c)(1),
(2), (4) Date: Jul. 26, 2004

(87) PCT Pub. No.: WO03/047045

PCT Pub. Date: Jun. 5, 2003

(65) Prior Publication Data

US 2005/0112911 A1    May 26, 2005

(30) Foreign Application Priority Data

Nov. 28, 2001 (DE) .................... 101 58 384

(51) Int. Cl.
*H01R 12/00* (2006.01)
(52) U.S. Cl. .............. 439/63; 439/581; 439/940
(58) Field of Classification Search ............ 439/63, 439/581, 483, 940
See application file for complete search history.

(56) References Cited

U.S. PATENT DOCUMENTS

| | | | | |
|---|---|---|---|---|
| 5,879,166 | A * | 3/1999 | Wang ............ | 439/63 |
| 5,897,384 | A * | 4/1999 | Hosler, Sr. ...... | 439/63 |
| 5,984,689 | A * | 11/1999 | Dong ............ | 439/64 |
| 6,030,231 | A * | 2/2000 | Sarkiniemi ...... | 439/63 |
| 6,050,848 | A * | 4/2000 | Yao ............. | 439/483 |
| 6,106,304 | A * | 8/2000 | Huang ........... | 439/63 |
| 6,527,561 | B1 * | 3/2003 | Glauser ......... | 439/63 |
| 6,682,354 | B1 * | 1/2004 | Carson et al. ... | 439/63 |
| 6,811,405 | B1 * | 11/2004 | Huang ........... | 439/63 |

FOREIGN PATENT DOCUMENTS

| | | |
|---|---|---|
| EP | 0 874 421 | 10/1998 |
| GB | 2 316 550 | 2/1998 |

* cited by examiner

*Primary Examiner*—Gary F. Paumen
(74) *Attorney, Agent, or Firm*—Herbert Dubno; Andrew Wilford

(57) ABSTRACT

A printed-circuit board is formed at a front edge with a cutout. A plug has a base body adapted to fit in the cutout and formed with a pair of shoulders bearing flatly on the board at edges of the cutout. A pair of wing-shaped connecting elements project oppositely from the body and lie flatly on the board adjacent the edges of the cutout so that the elements can be soldered to the board to fix the base body in the cutout.

14 Claims, 2 Drawing Sheets

PLUG

CROSS REFERENCE TO RELATED APPLICATIONS

This application is the U.S. national phase of PCT application PCT/EP02/13444, filed 28 Nov. 2002, published 5 Jun. 2003 as WO 03/047045, and claiming the priority of German patent application 10158384.2 itself filed 28 Nov. 2001.

FIELD OF THE INVENTION

The invention relates to a plug with a base body and contact elements in the interior of the base body.

BACKGROUND OF THE INVENTION

Such plugs are used as electrical connections for electronic devices of all types in large numbers. In the course of miniaturization of such devices, the plugs of the devices are applied directly on the printed circuit boards upon which the electronic components of such devices are arranged.

The printed circuit boards which can be especially formed of multilayer circuit boards, have a high packing density of their conductive tracks and components. The electronic components are applied to the respective printed circuit boards by means of mounting automatons automatically and are there soldered in place. The production of such assemblies is referred to as the SMD (Surface Mounting Device) technique.

With this technique at low fabrication cost, complex arrangements of components on printed circuit boards can be fabricated in arrangements of relative small size.

It is, however, a problem to integrate plugs in this kind of fabrication process. The use of plugs as SMD components is indeed basically known, but the automatic application of such plugs and their connection to the conductors of the printed circuit board is associated with significant drawbacks because of the relative sizes of such plugs. As a consequence, such plugs are typically soldered by hand to the printed circuit boards, which undesirably increases the fabrication costs of such devices. A further significant problem resides in that application of such plugs to the printed circuit board should be capable of insuring that the unit which is thus formed will have the smallest possible size.

OBJECT OF THE INVENTION

The invention has as its object to so form a plug of the type described at the outset that it can be applied to a printed circuit board in the most rational and space-saving manner possible.

SUMMARY OF THE INVENTION

This object is attained in that the plug has a base body and contact elements which extend into the exterior of the base body. At opposite sides of the outer wall of the base body, two wing-shaped connector elements open outwardly. These connector elements project over the rear side of the base body whereby their undersides form contact surfaces for producing solder connections to a printed circuit board. The connector elements provided on the plug according to the invention serve to enable establishment of a solder connection with the respective printed circuit board which forms a ground connection of the plug. Because of the large area configuration of the contact surface which is seated directly on the printed circuit board, an especially good ground connection of the plug is obtained.

Furthermore, with the connector elements, good mechanical retention of the plug upon the board can be obtained. The plug can thus be positioned on the board by means of an automated mounting machine as an SMD component reliably in a precise position.

Since the connector elements open laterally at the base body of the plug, the base body projects both upwardly and also downwardly beyond the connector elements. This means that the plug can be mounted on the board to lie more deeply than plugs have been positioned otherwise so that the spatial requirements for the plug can be held exceptionally small.

The undersides of the connector elements of the plug thus extend in a connecting plane in which preferably the underside of an internal conductor extending over the back side of the plug also lies. This internal conductor can be soldered together with the contact surfaces of the connecting elements to the respective board by means of an automated soldering process. This soldering process can be carried out especially effectively in an automated finishing step.

In an especially preferred embodiment, the connector elements close against outer walls in regions of the rear segment of the base body, whereby the rear segments are disposed in a cutout or recess of the board. The size of the cutout is matched to the shape of the rear segment. In this manner an especially space-saving application of the plug to the board is achieved. In addition, the plug is positionable precisely in the cutout and thus is exactly positionable using the cutout on the board. Finally by an appropriate choice of the lengths of the connector elements, the plug can be secured upon the board against tilting since the center of gravity of the plug lies upon the board. In this manner dislocation of the plug with respect to the seat upon the board can be avoided.

A precondition for this aspect of the invention is however a certain minimum length of the connector elements. A greater length of the connector elements results however in an undesirable increase in the weight of the plug.

In an especially advantageous embodiment of the plug according to the invention, the base body has shoulders which extend like the connector elements on oppositely disposed sides of the outer wall of the base body. The shoulders have bearing surfaces which lie in the same connecting plane as the contact surfaces. Preferably the shoulders extend over the entire length of the base body.

During the mounting process, the plug is seated on at least one board, whereby in this case not only the contact surfaces of the connector elements but also the bearing surfaces of the shoulders lie upon the upper surface of the board. Thus even for the case in which the connector elements have only a minimum length, a reliable position-exact retention of the plug upon the board on which it is seated can be obtained.

The boards are arranged during the mounting process in multiples for so-called multiple uses. Depending upon the arrangement of the boards, the connecting elements and shoulders of a plug can be caused to rest upon one board or upon two mutually abutting boards. In the case in which the shoulders and connecting elements rest upon different boards as a result of the mounting at the edge of the board in which the recess for receiving the rear segments of the base body is provided, a segment can be connected to a second board with additional board material upon which the shoulders of the plug mounting upon the first board can rest. This additional board material can serve alone for position stabilization of the plug during the mounting process and during the soldering process. After the soldering process has terminated, the additional board material can be removed from the second board.

BRIEF DESCRIPTION OF THE DRAWING

The invention will be further described based upon the drawings. They show.

SPECIFIC DESCRIPTION

Figure 1:
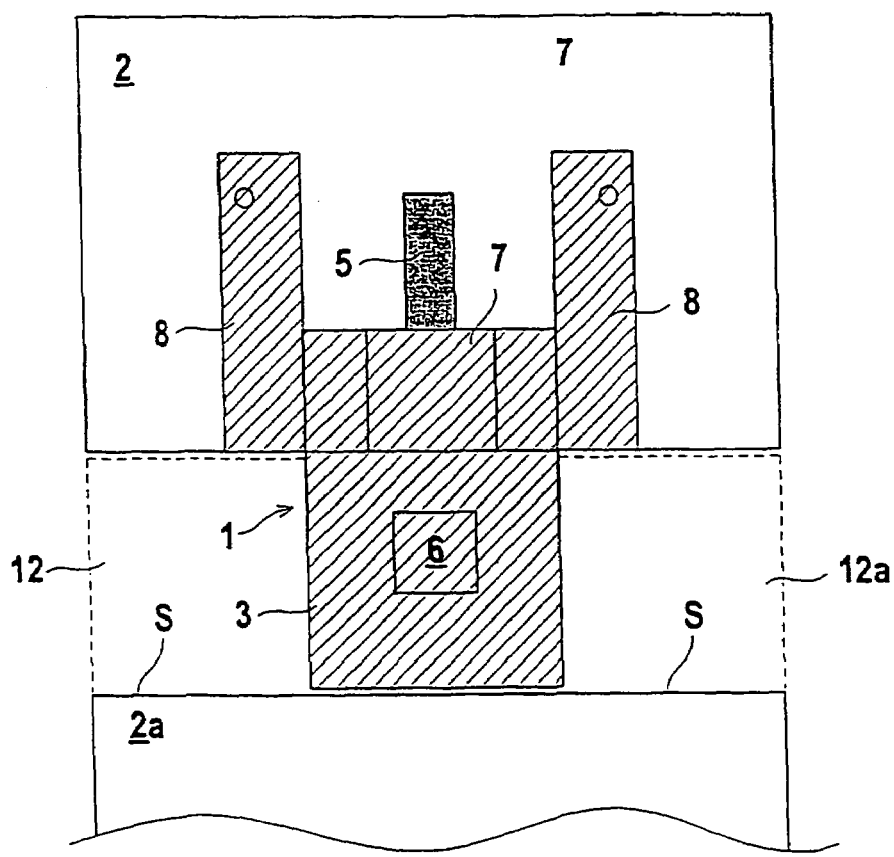
FIG. 1 a schematic illustration of an embodiment of a plug according to the invention mounted upon a printed circuit board.
Figure 2:
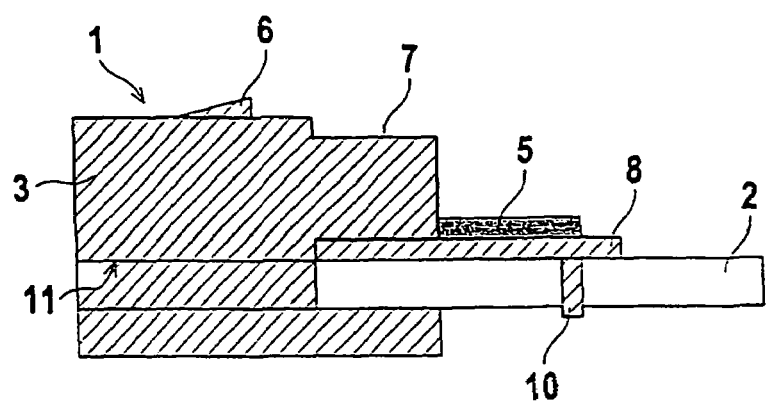
FIG. 2 a side view of the arrangement according to FIG. 1.
Figure 3:
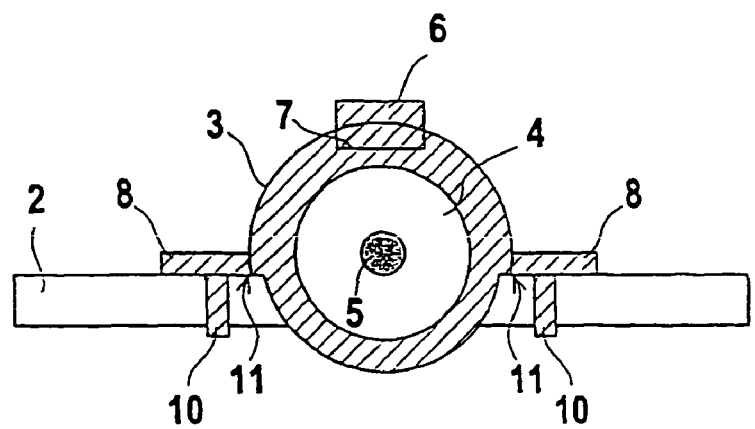
FIG. 3 a cross section through the arrangement according to FIG. 2.

FIGS. 1–3 show an embodiment of the plug 1 according to the invention which is mounted on a printed circuit board 2 as an SMD (Surface Mounting Device) component. The printed circuit board 2, which, for example, is constituted as a multilayer board with different conductive patterns in each layer, has only been shown fragmentarily in the Figures and in a schematic form. The plug 1 according to the invention or a multiplicity of such plugs 1, are mounted on the board 2 by means of an automated mounting machine or mounting automaton such that an automated soldering connection can also be formed between the boards 2 and the plugs 1.

Figure 4:
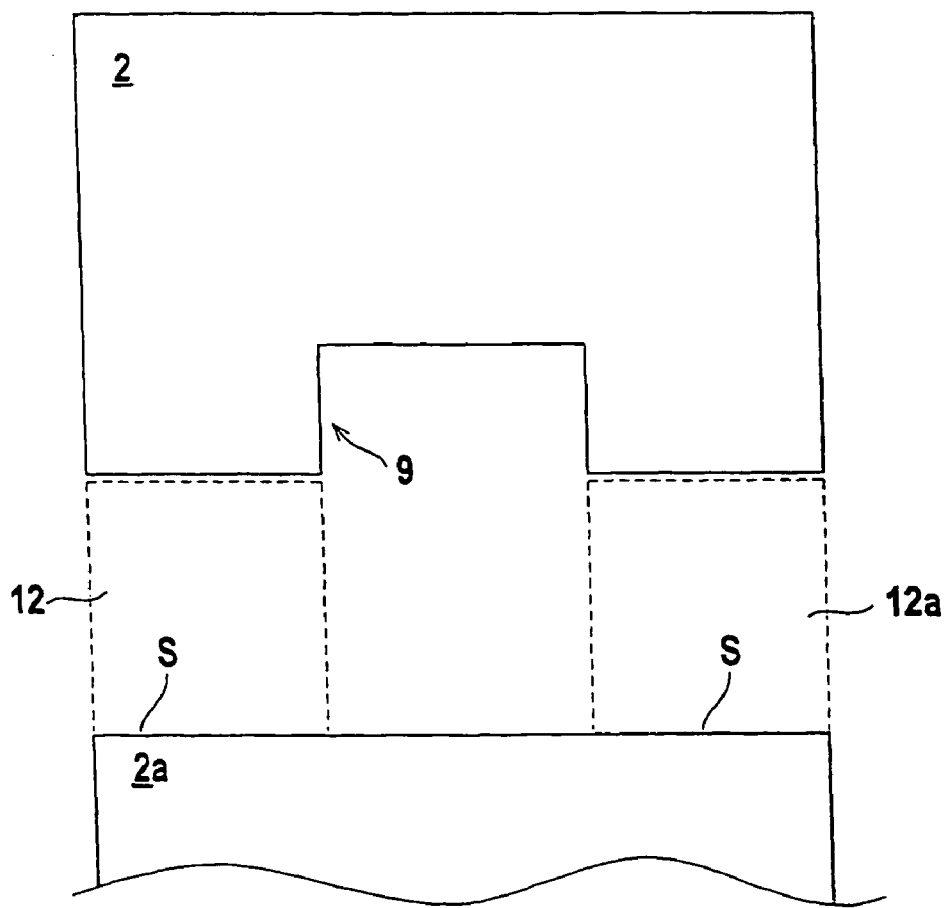
FIG. 4 a plan view of the board according to FIG. 1 without a plug.

During this finishing step, the boards 2 are arranged in a multiple array, so-called multiple use. In FIGS. 1 and 4 the multiple arrangement is signified by two boards 2 and 2a which border each other and abut at their longitudinal sides.

The plug 1 has a base body 3 which is comprised as a die cast or injection-molded part and has a substantially rotation symmetrical configuration with respect to its longitudinal axis. In the interior of the base body 3 there is an insulator 4 which preferably is comprised of a plastic. Additional components can also be located in the interior of the base body of the plug 1, especially contact elements. One of the contact elements is formed from an internal conductor 5 which extends through the center of the interior of the base body 3 in its longitudinal direction and projects beyond the rear side of the base body 3.

On the upper side of the outer wall of the base body 3 there is located a detent nose 6 for fixing a socket member on the plug.

In addition on the upper side of the base body 3 there is a recess 7 which forms a so-called "pick'n place" surface. On the recess 7 the plug 1 can be fitted onto the mounting automaton for gripping thereby to place the plug 1 upon the board 2. The plug 1 has two wing-shaped connecting elements 8 which open outwardly on opposite sides of the outer wall of the base body 3. The identically configured connecting elements 8 each have a rectangular contour and are formed in one piece with the base body 3. The connecting elements 8 have a constant rectangular cross section over their entire lengths.

As is especially visible from FIG. 1, the connecting elements 8 are joined flushly to rear segments of the base body 3. As a result, front ends of the connecting element 8 project beyond the rear side of the base body 3.

The planar undersides of the connecting element 8 form contact surfaces and extend in a horizontal connecting plane. In this connecting plane the underside of the inner conductor 5, which also forms a contact surface, likewise runs.

To mount the plug on the board 2, the plug 1 is so placed on the board 2 that the contact surfaces of the connecting elements 8 and the inner conductor 5 rest upon the upper surface of the board 2 and can be soldered thereto. The solder locations on the contact surfaces of the connecting elements 8 form the ground connection of the plug 1.

As is especially visible from FIG. 4, the board 2, upon which the plug 1 is mounted, has a rectangular cutout 9 which opens at the front edge of the board 2. The plug 1 is seated on the board 2 from above so that the rear segment of the base body 3 lies in the cutout 9. Since the connecting elements 8 only project laterally from the outer wall of the base body 3 in the region of the rear segment, these connecting elements 8, when the rear segment lies in the cutout 9, rest with their entire surfaces on the board 2. The rear edges of the connecting elements 8 thus terminate flush with the edge of the board 2. The cutout 9 is matched to the shape of the front segment so that it is received without play in the cutout 9. In this manner an exact positioning of the plug 1 on the printed circuit board 2 is ensured. Since the plug 1 is itself recessed in the cutout 9, it only occupies a small amount of space.

As is especially visible from FIGS. 2 and 3, positioning pins 10 project from the undersides of the connecting elements 8. Upon setting of the plug 1 on the board 2, the positioning pins 10 pass through holes in the board 2. This gives rise to an improved positioning precision of the plug 1 on the board 2 and in addition to a position stabilizer of the plug 1.

Basically the connecting elements 8 should extend far enough beyond the back side of the base body 3 that the center of gravity of the plug 1 lies upon the board 2 and thus ensures that the plug 1 can be secured against tilting relative to the board 2.

In the present case, the lengths of the connecting elements 8 can be shorter so that they alone cannot ensure a secure retention of the plug on the board 2.

For further stabilization of the plug 1 on the board 2, shoulders 11 are provided which are arranged on opposite sides of the outer wall of the base body 3.

As will be apparent from FIGS. 2 and 3, the shoulders 11 lie flush with faces of the connecting elements 8. The shoulders 11 can thus form horizontally extending bearing surfaces by means of which the shoulders 11 rest upon the board 2 from above. The bearing surfaces lie in the connection plane in which the contact surfaces of the connecting elements 8 also lie. As can be seen from FIGS. 2 and 3, the bearing surfaces extend directly into the associated contact surfaces.

As can be seen from FIG. 3, the base body 3 has a substantially hollow cylindrical shape. The wall thickness of the base body 3 in the region above the connection plane is somewhat larger than in the region below the connection plane. Thus the portion of the base body 3 lying above the connection plane forms a cylindrical element whose outer diameter is larger than that of the cylindrical element which forms the portion of the base body 3 below the connection plane. The bounding surfaces between these two portions form the shoulders 11 with their planar bearing surfaces.

For position stabilization of the plug 1, the shoulders 11 lie upon the edges of the board 2. In the simplest case, the shoulders 11 of the base body 3 rest upon the same board 2 upon which the connecting elements 8 of the base body 3 also lie and to which the plug 1 is fastened. In this case the cutout 9 and the board 2 are so dimensioned that the bearing surfaces of the shoulders 11 lie along their edges.

In an especially advantageous embodiment, the shoulders 11 lie upon a second board 2a. This case has been illustrated in FIGS. 3 and 4.

The second board 2a is connected to the front edge of the first board 2 at which the cutout 9 for receiving the rear segment of the base body 3 opens. At the front edge of the second board 2a, additional board material is connected and is joined with the second board 2a along an intentional-break line S.

Additional board material is in the form of two mutually parallel lugs 12, 12a. Between the lugs 12, 12a lies an intervening space whose width is matched to that of the cutout 9 of the first board 2 and forms an extension of this cutout 9. The total length of the intervening space and the cutout 9 matches the total length of the plug 1.

To mount the plug, the plug is seated from above on the first board 2 so that its connecting element 8 rests upon the board 2 and the shoulders 11 lie upon the edges of the first board 2 in the rear segments of the latter bounding the cutout 9. The front regions of the shoulders 11 which are connected to the rear segment rest upon the lugs 12, 12a of the additional board material. As a consequence the plug 1 is supported over the entire length of the shoulders 11 and the connecting elements 8 on supporting surfaces. The plug especially, is thereby secured against undesired tipping.

After the solder connection between the connecting elements 8 and the internal conductor 5 of the plug 1 on the one hand and the first board 2 on the other, the multiple use is separated and the individual boards are disconnected from one another. The additional board material is removed from the thus separated second board 2a along the intentional break line S.

The invention claimed is:

1. In combination with a printed-circuit board formed at a front edge with a cutout, a coaxial plug comprising:
    a base body fitted in the cutout and formed with a pair of shoulders bearing flatly on the board at edges of the cutout; and
    a pair of wing-shaped connecting elements projecting oppositely from the body and lying flatly on the board adjacent the edges of the cutout, whereby the elements can be soldered to the board to fix the base body in the cutout.

2. The plug/board combination defined in claim 1, further comprising:
    an internal conductor extending in and insulated from the base body.

3. The plug/board combination defined in claim 2 wherein the conductor is concentric to the base body and extends longitudinally therepast.

4. The plug/board combination defined in claim 1 wherein the shoulders are coplanar with each other and with faces of the connecting elements.

5. The plug/board combination defined in claim 1 wherein the connecting elements are identical.

6. The plug/board combination defined in claim 1 wherein the connecting elements extend longitudinally past a rear end of the base body.

7. The plug/board combination defined in claim 1 wherein the base body is formed to each side of the cutout underneath the respective connecting element with a hole and the connecting elements each have a stabilizing pin fitted to the respective hole.

8. The plug/board combination defined in claim 1 further comprising
    solder securing the shoulders and faces of the connecting elements to the board.

9. The plug/board combination defined in claim 1 wherein the base body is tubular.

10. The plug/board combination defined in claim 9 wherein the base body is to one side of the shoulders of part-cylindrical shape with a predetermined large diameter of curvature and is to the other side of the shoulders of part-cylindrical shape with a predetermined small diameter of curvature.

11. The plug/board combination defined in claim 1, further comprising
    a second board coplanar with and spaced from the first-mentioned board, the shoulders lying also on the second board.

12. The plug/board combination defined in claim 11 wherein the boards are joined at a weakened line traversing the shoulders, whereby the second board can be broken off the first board at the weakened line to leave the body on the first board.

13. The plug/board combination defined in claim 11 wherein the second board has a pair of lugs flanking the body.

14. The plug/board combination defined in claim 1 wherein the body is formed with a recess adapted to fit with a mounting tool.

* * * * *